(12) United States Patent
Li et al.

(10) Patent No.: US 9,263,264 B2
(45) Date of Patent: Feb. 16, 2016

(54) OXIDE REMOVAL FROM SEMICONDUCTOR SURFACES USING A FLUX OF INDIUM ATOMS

(75) Inventors: Lianhe Li, Leeds (GB); Alexander Davies, Leeds (GB); Edmund Linfield, Leeds (GB)

(73) Assignee: University of Leeds, Leeds (GB)

( * ) Notice: Subject to any disclaimer, the term of this patent is extended or adjusted under 35 U.S.C. 154(b) by 0 days.

(21) Appl. No.: 14/005,084

(22) PCT Filed: Mar. 14, 2012

(86) PCT No.: PCT/GB2012/050560
§ 371 (c)(1),
(2), (4) Date: Sep. 13, 2013

(87) PCT Pub. No.: WO2012/123741
PCT Pub. Date: Sep. 20, 2012

(65) Prior Publication Data
US 2014/0008767 A1  Jan. 9, 2014

(30) Foreign Application Priority Data

Mar. 14, 2011  (GB) .................................. 1104261.1

(51) Int. Cl.
*H01L 29/06* (2006.01)
*H01L 21/02* (2006.01)
(Continued)

(52) U.S. Cl.
CPC ........... *H01L 21/02661* (2013.01); *B82Y 20/00* (2013.01); *H01L 21/02* (2013.01);
(Continued)

(58) Field of Classification Search
CPC .............. H01L 21/02661; H01L 21/02; H01L 21/02395; H01L 21/0243; H01L 21/02463; H01L 21/0259; H01L 21/20; H01L 21/306; H01L 21/02546; H01L 21/0262; H01L 21/02631; B82Y 20/00
See application file for complete search history.

(56) References Cited

U.S. PATENT DOCUMENTS

| 4,948,751 A | 8/1990 | Okamoto et al. |
| 5,898,721 A * | 4/1999 | He .............................. 372/45.01 |

(Continued)

FOREIGN PATENT DOCUMENTS

| EP | 0037005 A1 | 10/1981 |
| GB | 2372630 A | 8/2002 |

(Continued)

OTHER PUBLICATIONS

Atkinson P et al., "Site-controlled growth and luminescence of InAs quantum dots using in situ Ga-assisted deoxidation of patterned substrates," Applied Physics Letters 93, 101908.

(Continued)

*Primary Examiner* — Stephen W Smoot
*Assistant Examiner* — Vicki B Booker
(74) *Attorney, Agent, or Firm* — Thomas J. Engellenner; Reza Mollaaghababa; Pepper Hamilton LLP

(57) ABSTRACT

A method of removing at least one oxide from a surface of a body of semiconductor material is disclosed. The method includes arranging the body in a vacuum chamber and maintaining a temperature of the body in the vacuum chamber within a predetermined range, or substantially at a predetermined value, while exposing said surface to a flux of indium atoms. Corresponding methods of processing an oxidized surface of a body of semiconductor material to prepare the surface for epitaxial growth of at least one epitaxial layer or film over said surface, and methods of manufacturing a semiconductor device are also disclosed.

25 Claims, 6 Drawing Sheets

(51) Int. Cl.
  *B82Y 20/00* (2011.01)
  *H01L 21/20* (2006.01)
  *H01L 21/306* (2006.01)
  *H01S 5/12* (2006.01)
  *H01S 5/34* (2006.01)

(52) U.S. Cl.
  CPC ........ *H01L21/0243* (2013.01); *H01L 21/0259* (2013.01); *H01L 21/0262* (2013.01); *H01L 21/02395* (2013.01); *H01L 21/02463* (2013.01); *H01L 21/02546* (2013.01); *H01L 21/02631* (2013.01); *H01L 21/20* (2013.01); *H01L 21/306* (2013.01); *H01S 5/1231* (2013.01); *H01S 5/3412* (2013.01); *H01S 2304/02* (2013.01)

(56) References Cited

U.S. PATENT DOCUMENTS

| | | | |
|---|---|---|---|
| 5,998,809 | A | 12/1999 | Chen et al. |
| 2002/0166501 | A1 | 11/2002 | Shi |

FOREIGN PATENT DOCUMENTS

| | | | |
|---|---|---|---|
| JP | 2003273018 | A | 9/2003 |
| WO | 0209188 | A1 | 1/2002 |
| WO | 2005027227 | A1 | 3/2005 |

OTHER PUBLICATIONS

Li L.H. et al., "In-assisted desorption of native GaAs surface oxides," Applied Physics Letters 99, 061910.
Bastiman F et al., "Ga assisted oxide desorption on GaAs(0 0 1) studied by scanning tunnelling microscopy," Journal of Crystal Growth 312, 1687-1692, May 1, 2010.
International Search Report, PCT/GB2012/050560, mailed Jan. 11, 2013 (4 pages).
Adomi et al., "Molecular beam epitaxial growth of GaAs and other compound semiconductors", Thin Solid Films, vol. 205, 1991, pp. 182-212.
David Leadley, "PVD-Physical Vapour Deposition, MBE-Molecular Beam Epitaxy", The University of Warwick, Nov. 18, 2009, pp. 1-5.
Yang and Mooney, "The characterization of Indium desorbed Si surfaces for low temperature surface cleaning in Si molecular beam epitaxy", Journal of Applied Physics, vol. 58, Sep. 1, 1985, pp. 1854-1859.
Search Report, GB1104261.1, search date Jun. 10, 2011 (6 sheets).
Search Report, GB1104261.1, search date Jul. 21, 2011 (5 sheets).
European Examination Report issued Jan. 22, 2015 corresponding to European Application No. 12715715.4 (6 sheets).

* cited by examiner

OXIDE REMOVAL FROM SEMICONDUCTOR SURFACES USING A FLUX OF INDIUM ATOMS

FIELD OF THE INVENTION

The present invention generally relates to the use of indium to remove oxide from a semiconductor surface, and to semiconductor devices produced using such techniques. Particular embodiments relate to the use of a flux of indium atoms to remove oxide from a semiconductor surface to prepare that surface for overgrowth of at least one epitaxial layer or film.

BACKGROUND TO THE INVENTION

A wide variety of techniques for the manufacture of semiconductor devices and semiconductor structures are known. These include, for example, techniques in which a layer, film, or some other body of material is formed over a body of semiconductor material. For numerous reasons it may be desirable to remove oxides from the surface of the body of semiconductor material before the body of material is formed over it. A general problem is how to remove such oxides without detrimentally affecting the semiconductor body surface. More specific problems will be appreciated from the following discussion.

Ex-situ pattering of GaAs substrates, combined with molecular beam epitaxy (MBE) regrowth, provides a technique for the wafer scale production of new designs of three-dimensional devices. However, to exploit fully the length scales available through MBE growth, and achieve patterning in all three-dimensions, it is necessary to regrow active layers in close proximity to the patterned interface. The production of a clean, smooth regrowth interface is therefore essential. Conventionally, cleaning of a GaAs surface prior to MBE growth is achieved by thermal desorption of oxide layers. Such cleaning requires temperatures in excess of ~580° C. and an As overpressure, but can have limited effectiveness. This is because, at high temperatures, the most stable surface oxide, $Ga_2O_3$, reacts with the host substrate through the reaction $Ga_2O_3 + 4GaAs \rightarrow 3Ga_2O\uparrow + 2As_2$ (or $As_4$)$\uparrow$ to form the more volatile oxide $Ga_2O$. Thermal cleaning of the GaAs surface, therefore, tends to result in a pitted surface owing to GaAs removal from the substrate. Such surface pits are considered to be the cause of the formation of macroscopic 'mounds' during the epitaxial growth of GaAs, and require planarization with a GaAs buffer layer of typically ~0.5 μm thickness. This issue must be addressed to achieve the high quality interfaces required for fabricating nanostructures through regrowth on patterned substrates.

Recently, both hydrogen-assisted cleaning and gallium-assisted oxide desorption have been shown to reduce pit formation significantly, leading to flat, unpitted and oxide-free surface. This has led to the growth of site-controlled quantum dots (QDs) on patterned substrates, with reasonably good optical properties. Hydrogen-assisted cleaning allows gallium oxides to be removed at lower temperatures, ~400° C., without surface pitting. However, this method is known to lead to Fermi-level surface pinning and possible degradation of the surface if the hydrogen dose is not precisely controlled. In addition, surface contamination could be introduced during the hydrogen-assisted cleaning process, if extreme care is not taken. Gallium-assisted desorption removes native GaAs surface oxide at temperatures above ~420° C., in the absence of an arsenic flux, through the reaction $Ga_2O_3 + 4Ga \rightarrow 3Ga_2O$. Compared with hydrogen-assisted cleaning, gallium-assisted desorption has the practical advantage that the desorption can be carried out in the growth chamber, with the oxide removal being monitored in-situ by reflection high-energy electron diffraction (RHEED). Furthermore, there is no requirement for additional apparatus, such as a hydrogen source and associated turbomolecular pump, or a dedicated cleaning chamber. However, the technique is very sensitive to the precise amount of oxide on the surface. Sub-monolayer precision of the gallium flux is required to remove the oxides effectively, but avoid droplet formation and the infill of pre-patterned holes. This is a direct consequence of the lower vapour pressure of gallium, compared with the underlying GaAs substrate—any excess gallium will re-evaporate more slowly than the decomposition of the underlying GaAs substrate even for substrate temperatures as high as 650° C.

SUMMARY OF THE INVENTION

It is an aim of certain embodiments of the present invention to obviate, mitigate, or solve, at least partly, one or more of the problems associated with the prior art.

According to a first aspect of the present invention, there is provided a method of removing at least one oxide from a surface of a body (for example a layer, film, or substrate) of semiconductor material, the method comprising:
  arranging the body in a vacuum chamber; and
  maintaining a temperature of the body in the vacuum chamber within a predetermined range, or substantially at a predetermined value, while exposing said surface to a flux of indium atoms.

As will be appreciated, the term "body" is being used in a broad sense to indicate a separate or distinct or identifiable mass of semiconductor material, and may take a wide variety of forms in different embodiments of the invention. For example, the body may be a semiconductor layer, a semiconductor film, a semiconductor substrate, or a semiconductor region, and may be provided on its own or may form part of a structure.

It will be appreciated that, although the temperature of the body is maintained within a predetermined range, or substantially at a predetermined value, temperatures elsewhere in the vacuum chamber may be different.

In certain embodiments of this aspect of the invention, and indeed of other aspects described below, the body consists at least substantially of a single semiconductor material. In alternative embodiments, however, it may comprise a plurality of semiconductor materials. For example, in certain embodiments the body may have a multi-layer structure, with different layers comprising different semiconductor materials. Each such layer may itself be regarded as a body, in the language of the appended claims. In certain embodiments, the body may have a gradually changing semiconductor composition. For example, the body in certain embodiments may comprise a semiconductor such as $Ga_{1-x}In_xAs$, with x varying with position in the body.

In certain embodiments, the body is a layer, film, substrate, or region consisting of a single semiconductor material.

Generally, the predetermined temperature or temperature range at or within which the body is held while exposed to the flux of indium atoms is arranged such that the indium atoms react with the desired oxide or oxides on or in the surface of the body, forming at least the more-volatile oxide $In_2O$ (one or more other oxides may be formed as well in certain embodiments). The indium oxide is then desorbed from the surface, along with other more-volatile oxides produced in certain embodiments as a result of the reaction between the original oxides and indium atoms. This technique provides the advantage that lower temperatures can be used than with prior art techniques, and/or damage to the surface can be avoided or reduced.

Another aspect of the invention provides a method of processing an oxidised surface of a body of semiconductor material to prepare the surface for epitaxial growth of at least one epitaxial layer or film over said surface, the method comprising;

arranging the body in a vacuum chamber; and maintaining a temperature of the body in the vacuum chamber within a predetermined range, or substantially at a predetermined value, while exposing said surface to a flux of indium atoms.

As with the first aspect, the predetermined temperature or temperature range is arranged such that indium atoms react with the desired oxide or oxides present in or on the oxidised surface of the body of semiconductor material to produce more-volatile compounds which can then be desorbed from the body surface. In this way, the undesired oxide or oxides present on the surface initially can be substantially completely removed, leaving a semiconductor surface suitable for epitaxial overgrowth.

Another aspect of the invention provides a method of manufacturing a semiconductor device (for example, an electronic device, an optoelectronic device, or semiconductor structure), the method comprising the steps of:

providing a body of semiconductor material having an oxidised surface;

processing said surface to prepare the surface for epitaxial growth of at least one epitaxial layer or film over the surface by arranging the body in a vacuum chamber and maintaining a temperature of the body in the vacuum chamber within a predetermined range, or substantially at a predetermined value, while exposing said surface to a flux of indium atoms;

and then, without removing the body from the vacuum chamber, growing an epitaxial layer or film over the prepared (i.e. processed) surface.

As will be appreciated, the above aspect involves growing the epitaxial layer or film without removing the body from the vacuum chamber so that oxides cannot reform on or in the prepared surface.

In certain embodiments, providing said body having an oxidised surface comprises growing the body in an epitaxial growth chamber and then removing the body from the epitaxial growth chamber.

For example, the body may have been grown in a growth chamber, and then it may have been necessary to remove the body from the chamber in order to pattern the surface in a desired way, for example using lithographic techniques. An unavoidable consequence of this removal from the growth chamber is that the body surface may become oxidised to a certain degree. This oxidised surface may then have to be cleaned using methods embodying the invention, in order to be able to continue epitaxial growth over the surface, to continue building up the desired semiconductor device or other such semiconductor structure.

Another aspect of the invention provides a method of manufacturing a semiconductor device, the method comprising the steps of:

providing a body of semiconductor material having a patterned surface;

processing said surface to prepare the surface for epitaxial growth of at least one epitaxial layer or film over the surface by arranging the body in a vacuum chamber and maintaining a temperature of the body in the vacuum chamber within a predetermined range, or substantially at a predetermined value, while exposing said surface to a flux of indium atoms;

and then, without removing the body from the vacuum chamber, growing an epitaxial layer or film over the prepared (i.e. processed) surface.

Typically, techniques used to pattern the body surface may have had the undesirable consequence of also allowing a degree of oxidisation of the surface. Thus, the patterned surface is exposed to the flux of indium atoms at a suitable temperature or within a suitable temperature range in order to remove the undesirable oxide or oxides.

In certain embodiments, the step of providing said body having a patterned surface comprises growing the body in an epitaxial growth chamber, removing the body from the growth chamber, and then patterning said surface out of the growth chamber (i.e. patterning the surface ex situ).

In certain embodiments, providing said body having a patterned surface comprises patterning said surface using a technique which results in oxidation of the patterned surface.

In certain embodiments, said patterned surface is patterned with at least one feature from a list comprising: hole; trench; groove; indentation; pit.

For example, the patterned surface may be patterned with an array of pits, each pit defining the position of a quantum dot structure to be formed in the eventual semiconductor device.

In certain embodiments, said patterned surface is patterned with an array of said features.

In certain embodiments, providing said body having a patterned surface comprises patterning said surface using a technique comprising lithography and etching.

In certain embodiments, said epitaxial layer or film grown over said patterned surface has a thickness of less than or equal to 20 nanometers. In certain embodiments, said thickness is even smaller, for example less than or equal to 10 nanometers.

In certain embodiments, said epitaxial layer or film grown over said patterned surface is a buffer layer.

After using prior art oxide removal techniques, it was typically necessary to grow thicker layers or films (e.g. buffer layers) over the "cleaned" surface before continuing to build up the semiconductor device or other structure, in order to compensate for surface imperfections (i.e. defects or damage) caused by the prior art oxide removal techniques. However, in certain embodiments of the invention, the use of indium flux to remove oxides enables those oxides to be removed in a manner which avoids or reduces damage or degradation to the surface being cleaned, and hence much thinner epitaxial layers or films (e.g. buffer layers) may be required.

In certain embodiments, the step of arranging the body in a vacuum chamber comprises arranging the body in a chamber and then evacuating the chamber such that said surface is exposed to at least a partial vacuum.

In certain embodiments, said partial vacuum is arranged such that said surface is exposed to a pressure of no greater than 1 e-5 mbar.

In certain embodiments, said chamber is an epitaxial growth chamber.

In certain embodiments, the step of maintaining a temperature of the body comprises maintaining the body at a substantially constant temperature (e.g., within said predetermined range) while exposing said surface to the flux of indium atoms.

In certain embodiments, the method may further comprise monitoring said surface using a reflection high-energy electron diffraction (RHEED) technique while exposing said surface to the flux of indium atoms. In such embodiments, the method may further comprise exposing said surface to said flux until clear surface reconstructions of semiconductor material are observed by RHEED.

In certain embodiments, the step of exposing the surface to the flux of indium atoms comprises exposing the surface to said flux for a duration of between 30 seconds and 1 hour, for example 30 seconds, 1 minute, 5 minutes, 15 minutes, 30 minutes, 45 minutes, or 1 hour In certain embodiments, the flux of indium atoms is in the range $1 \times 10^{12}$ to $1 \times 10^{14}$ atoms per square centimeter per second.

In certain embodiments, the flux is substantially continuous. In certain alternative embodiments the flux is pulsed.

In certain embodiments, the method further comprises ceasing said flux of indium atoms and maintaining a temperature of the body within a second predetermined range, or substantially at a second predetermined temperature, for a period of time.

In certain embodiments the second predetermined range may be the same as the above-mentioned predetermined range, but in alternative embodiments the second predetermined range may be different. Similarly, the second predetermined temperature may be the same as the above-mentioned predetermined temperature, or alternatively may be different. The purpose of this maintaining of the temperature within the second predetermined range or substantially at a second predetermined temperature after ceasing the flux of indium atoms is to assist in the removal, from the body surface, of indium atoms and indium compounds formed by reaction with the indium flux. For example, in certain embodiments the maintaining of the body within a second predetermined temperature range, or substantially at a second predetermined temperature, may comprise maintaining the body at a temperature of between 400° C. to 550° C. for a period of time having a duration in the range of 30 seconds to 2 hours (e.g. 0.5, 1, 5, 10, 15, 30, 60, 90, or 120 minutes). Such techniques can be used to achieve the results that the processed body surface is then substantially free of indium atoms and indium compounds, although indium atoms may be present at a certain low level, as described subsequently in this document, and its presence may be a signature of the use of a method embodying the invention for oxide removal.

In certain embodiments, the method further comprises ceasing said flux of indium atoms and supplying a flux of As while maintaining a temperature of the substrate within a third predetermined range, or substantially at a third predetermined temperature, for a period of time.

Similarly, this third predetermined range may be the same or different from the first and second predetermined ranges mentioned above, or in alternative embodiments may be different. Similarly, the third predetermined temperature may be the same as one of the first and second predetermined temperatures, or may be different. Generally, the third predetermined range or third predetermined temperature are arranged in combination with the particular materials involved to assist in the reaction of the As with products of the previous reaction between the indium flux and the semiconductor surface, including any oxides, to aid cleaning of the semiconductor surface.

In certain embodiments, the body is at least substantially monocrystalline.

In certain embodiments, the method further comprises forming the body by epitaxial growth.

In certain embodiments, the semiconductor material is a Group III-V or a Group IV semiconductor. Thus the semiconductor material may be selected from the following list: AlSb; AlAs; AlN; AlP; BN; BP; Bas; $B_{12}As_2$; GaSb; GaAs; GaN; GaP; InSb; InAs; InN; InP; AlGaAs; InGaAs; InGaP; AlInAs; AlInSb; GaAsN; GaAsP; GaAsSb; AlGaN; AlGaP; InGaN; InAsSb; InGaSb; C; Si; Ge; SiC; and SiGe. In certain embodiments, the semiconductor material may be a material comprising a combination of two or more of these listed materials. In certain embodiments, the semiconductor material may be a material selected from a list comprising: GaAs; GaSb; GaN; GaP; InAs; InSb; InN; and Si.

For example, in certain embodiments, the semiconductor material is silicon. In such embodiments, the step of maintaining a temperature of the body in the vacuum chamber within a predetermined range, or substantially at a predetermined value, while exposing said surface to a flux of indium atoms comprises maintaining a temperature of the body in the range 700° C. to 850° C. while exposing said surface to said flux.

As another example, in certain embodiments, the semiconductor material is GaAs. In such embodiments, the "at least one oxide" being removed may comprise gallium oxide, particularly $Ga_2O_3$. Additionally, or alternatively, the step of maintaining a temperature of the body in the vacuum chamber within a predetermined range, or substantially at a predetermined value, while exposing said surface to a flux of indium atoms may comprise maintaining a temperature of the body in the range 400° C. to 550° C. while exposing said surface to said flux.

Another aspect of the invention is the use of indium for the removal of at least one oxide from a surface of a body of semiconductor material, particularly, but not exclusively, for the removal of gallium oxide from a GaAs surface.

Another aspect of the invention is the use of indium in the processing of an oxidised surface of a body of semiconductor material to prepare the surface for epitaxial growth of an epitaxial layer or film over said surface, particularly, but not exclusively, in the processing of an oxidised surface of a body of GaAs.

Another aspect of the invention provides a semiconductor device manufactured using a method in accordance with any one of the above-mentioned aspects.

Another aspect of the invention provides a semiconductor device comprising:
  a body of semiconductor material having a patterned surface; and
  an epitaxial layer or film grown over said patterned surface, said surface having been prepared for overgrowth of said layer or film by exposure to a flux of indium atoms while under vacuum and being maintained substantially at a predetermined temperature or maintained within a predetermined temperature range.

In certain embodiments, said epitaxial layer or film grown over said patterned surface has a thickness of less than or equal to 20 nanometers.

Another aspect of the invention provides a semiconductor device comprising:
  a body of semiconductor material (e.g. a non-indium based semiconductor material) having a patterned surface; and
  an epitaxial layer or film grown over said patterned surface, wherein said epitaxial layer or film has a thickness less than or equal to 20 nm and indium atoms are present in said body at the patterned surface at a level of between $1 \times 10^{15}$ and $1 \times 10^{20}$ atoms/cm$^3$.

The above-mentioned range of indium atom concentration in the patterned surface is a signature of the fact that the patterned surface has been processed by a method in accordance with another aspect of this invention (i.e. by exposing the surface to a flux of indium atoms at a suitable temperature and within a suitable temperature range). Furthermore, the small thickness of the epitaxial layer or film grown over the patterned surface is indicative of the fact that the indium technique of embodiments of the present invention has been used to clean oxides from the patterned surface. The lack of surface damage resulting from use of the method embodying the invention enables such a thin layer or film to be utilised.

In certain embodiments, the thickness is less than or equal to 10 nanometers.

In certain embodiments, the epitaxial layer or film grown over the patterned surface is a buffer layer.

In certain embodiments, indium atoms are present in the body at the patterned surface at a level of between $1 \times 10^{15}$ and $1 \times 10^{20}$ atoms/cm$^{-3}$.

In certain embodiments, the semiconductor device is a distributed feedback laser.

In certain embodiments, the device comprises a quantum dot structure.

BRIEF DESCRIPTION OF THE DRAWINGS

Embodiments of the present invention will now be described with reference to the accompanying drawings, of which.

DETAILED DESCRIPTION OF EMBODIMENTS OF THE INVENTION

Figure 1:
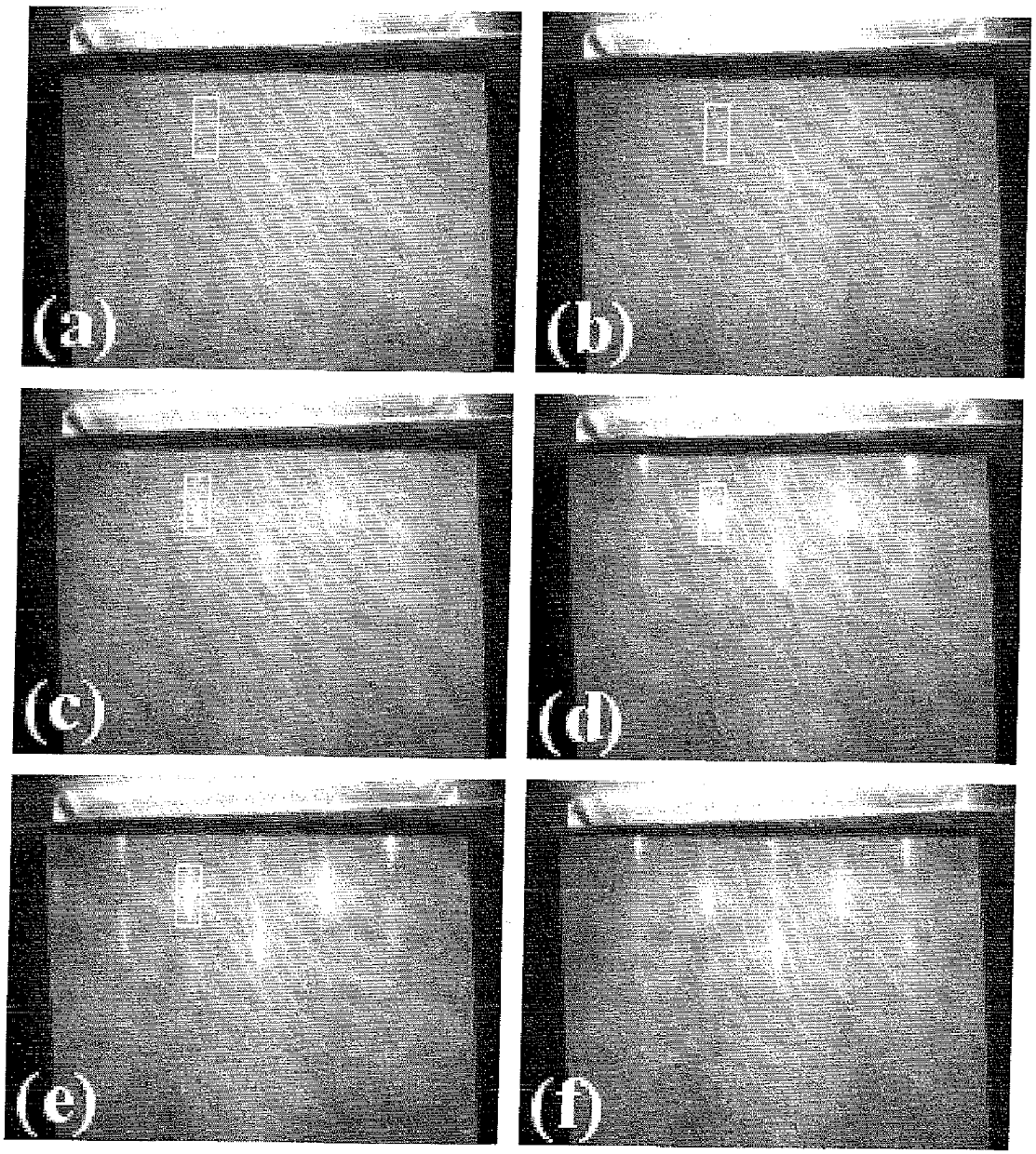
FIG. 1 shows RHEED patterns along the [110] azimuth at a substrate temperature of 530° C. for an indium flux of $6.3 \times 10^{12}$ atoms·cm$^{-2}$·s$^{-1}$ in a method embodying the invention. The patterns were taken at (a) 0 s, (b) 124 s, (c) 168 s, (d) 208 s and (e) 248 s. For comparison, the pattern (f) was obtained at a temperature of 600° C. under an arsenic overpressure after indium irradiation for 248 s.

Certain embodiments provide Indium-assisted desorption of native GaAs surface oxides. In the following description, indium-assisted desorption of native GaAs surface oxides at substrate temperatures of 480-550° C. is described. The oxides are removed through production of volatile gallium and indium suboxides, $Ga_2O$ and $In_2O$. Compared to a gallium-assisted desorption process, excess indium is easily removed at low temperature, leading to a clean, smooth surface. The feasibility of using indium-assisted desorption for the regrowth of high quality quantum dot structures is shown.

To overcome problems associated with prior art techniques, indium is used in certain embodiments of the invention as an alternative element which can react with $Ga_2O_3$ to produce volatile products, and which can also itself be readily evaporated at lower temperature from the underlying GaAs substrate. Compared with gallium, indium has a relatively large atomic size as well as a high vapour pressure. In principle, the large atomic size allows indium to react with surface oxides more effectively than gallium, whilst its high vapour pressure allows indium and its compounds, such as $In_2O$ or InAs, to be easily desorbed from the GaAs surface at temperature above ~500° C. Such desorption becomes more significant as the temperature increases. Similar to $Ga_2O$, $In_2O$ is a volatile suboxide at lower temperatures. The following reaction can be used in embodiments to remove gallium surface oxides: $Ga_2O_3 + 4In \rightarrow Ga_2O\uparrow + 2In_2O\uparrow$. If indium is used to replace gallium for assisting oxide desorption from a GaAs substrate, a cleaner, droplet-free surface is expected. In addition, as is the case for gallium-assisted desorption, indium-assisted desorption can be monitored in-situ by RHEED, and does not require additional apparatus since an indium cell is a standard source on most III-V MBE systems. In this description, we demonstrate that indium-assisted desorption of native GaAs surface oxides can indeed be accomplished at low temperatures. High quality QDs can be regrown after air-exposure of an epitaxially grown GaAs substrate following growth of only a very thin GaAs buffer layer.

Oxide desorption methods embodying the present invention were undertaken in a VG Semicon V-80H MBE system equipped with standard Ga, Al, In, Be, Si sources and an As cracker. Two type of substrates were used, i.e. epi-ready and air-exposed epitaxial substrates. The air-exposed epitaxial substrates were prepared by the following procedure: a 500 nm-thick GaAs layer were first grown on an epi-ready GaAs substrate after conventional thermal oxide removal. Each substrate was then removed from the MBE chamber and exposed to air for one day so that a layer of native oxide formed. These air-exposed epitaxial substrates were next reintroduced into the MBE chamber. Except where explicitly mentioned, all methods were performed using two-inch semi-insulating epi-ready GaAs substrates from AXT. After opening the as-received package from the supplier, the wafers were immediately mounted into indium-free wafer holders and loaded into the fast entry load-lock for 20 hours of outgassing at 150° C. Before their transfer to the growth chamber, the wafers were then outgassed for three hours at 450° C. (thermocouple temperature) in the preparation chamber. The oxide desorption methods were performed in the growth chamber. The procedure consisted of ramping up the substrate to a fixed temperature in the range 480° C.-550° C., and then exposing the substrate to a continuous, fixed flux of indium, in the absence of arsenic. This induces formation of volatile gallium and indium suboxides. Several indium fluxes ($1.5 \times 10^{12}$, $3.2 \times 10^{12}$, $6.3 \times 10^{12}$ and $3.1 \times 10^{13}$ atoms·cm$^{-2}$·s$^{-1}$) were investigated. All substrate temperatures were measured with the Bandit system using the substrate heater as the source of radiation. The progress of oxide removal was monitored in-situ using RHEED.

Typical RHEED patterns along the [110] azimuth at different time are shown in FIG. 1 for a substrate temperature of 530° C., and an indium flux of $6.3 \times 10^{12}$ atoms·cm$^{-2}$·s$^{-1}$. Before indium irradiation, a diffuse RHEED pattern with the specular spot near the centre is observed (FIG. 1(a)), indicating that the GaAs surface is covered by amorphous oxide. Once the indium shutter opens, bulk diffraction spots gradually appear and a streaky diffraction pattern develops as the indium irradiation time increases (FIGS. 1(b-e)). This is very similar to the situation observed for gallium-assisted desorption, and clearly indicates the removal of native oxides. We note that, without indium irradiation, there was no visible change in the diffuse RHEED pattern when the substrate was maintained at 530° C. for up to 1 hour in the absence of an arsenic overpressure. This confirms that indium irradiation is playing a key role in removing native GaAs surface oxides.

Figure 2:
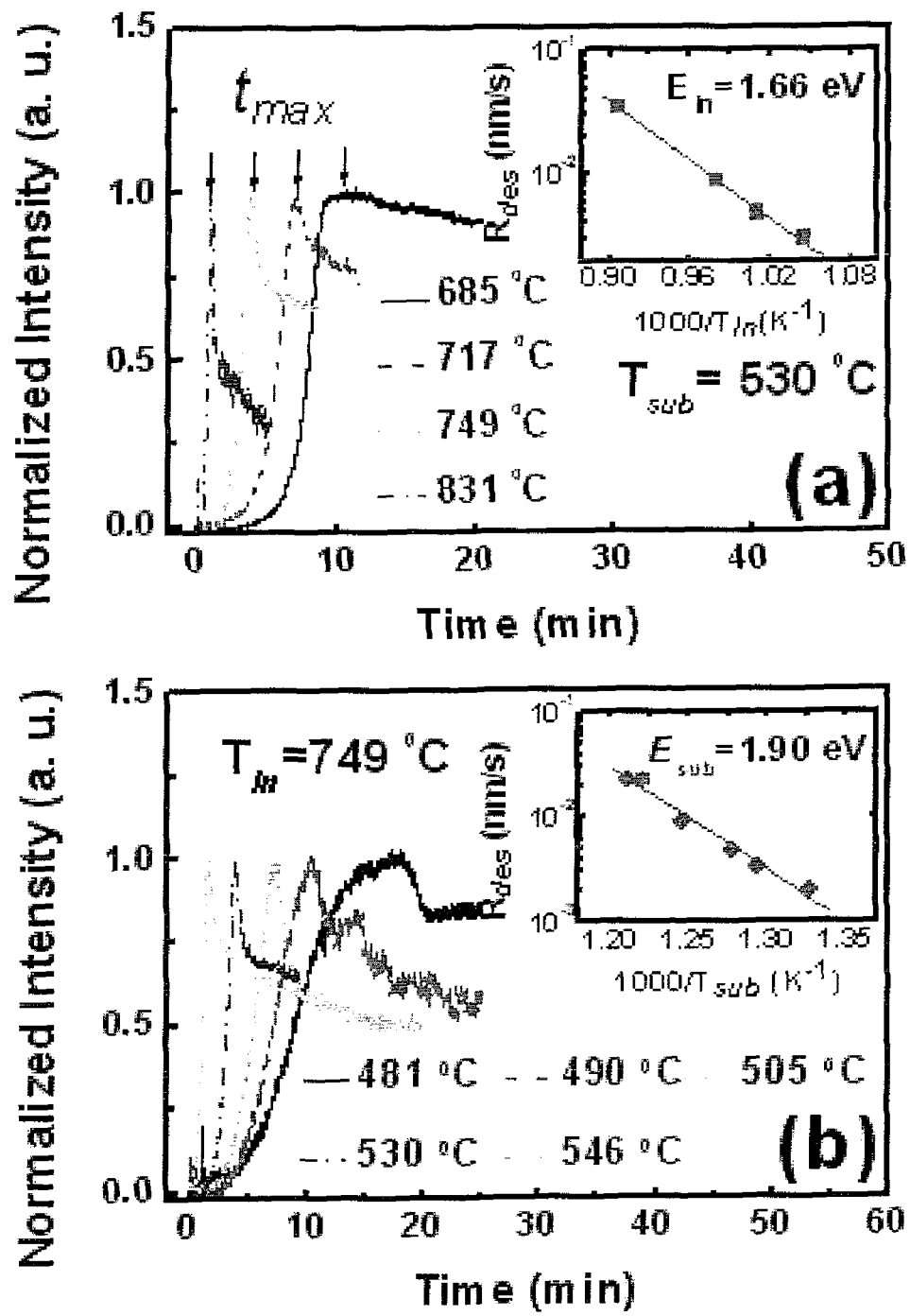
FIG. 2 shows normalized RHEED intensity as a function of indium irradiation time for different (a) indium cell temperatures and (b) substrate temperatures in methods embodying the invention. The indium cell temperatures of 685° C., 717° C., 749° C. and 831° C. correspond to indium fluxes of $1.5 \times 10^{12}$, $3.2 \times 10^{12}$, $6.3 \times 10^{12}$ and $3.1 \times 10^{13}$ atoms·cm$^{-2}$·s$^{-1}$, respectively Insets: Indium cell temperature and substrate temperature dependencies of $R_{des}$.

FIG. 2 shows the normalized RHEED intensity as a function of indium irradiation time under different conditions. The signal was acquired from a bulk diffraction spot next to the specular spot (rectangle in FIG. 1). In FIG. 2 (a), data is shown for oxide desorption at 530° C. using various indium fluxes, ranging from $1.5 \times 10^{12}$ to $3.1 \times 10^{13}$ atoms·cm$^{-2}$·s$^{-1}$ corresponding to an indium cell temperature change from 685 to 831° C. In FIG. 2 (b), data is shown for oxide desorption at different substrate temperatures using a fixed indium flux of $6.3 \times 10^{12}$ atoms·cm$^{-2}$·s$^{-1}$ (an indium cell temperature of 749° C.). As the indium irradiation time increases, the RHEED intensity initially increases, then decreases, and finally tends to a saturation value. The initial intensity increase indicates a reduction of the oxide layer thickness, the strongest intensity then corresponds to when the oxide layer is completely removed, the intensity decrease is presumably due to the excess indium accumulating on the surface, whilst final intensity saturation may suggest that the incident indium flux matches the evaporation of indium from the surface.

The oxide desorption rate depends strongly on both the substrate temperature and indium cell temperature. It is known that the temperature dependence of a chemical reaction is generally described by the Arrhenius relation. The temperature-dependent chemical rate constant is then given by:

$$\gamma(T_{sub}) = C(T_{sub}) \exp\left(-\frac{E_{sub}}{k_B \cdot T_{sub}}\right) \quad (1)$$

Similarly, the temperature dependence of the indium flux delivered from an effusion cell can be described by the Arrhenius relation, and written as:

$$\psi(T_{In}) = D(T_{In}) \exp\left(-\frac{E_{In}}{k_B \cdot T_{In}}\right) \quad (2)$$

The constants, $C(T_{sub})$ and $D(T_{in})$, are weak functions of the temperature of the material being etched/evaporated, $T_{sub}$ and $T_{in}$ are the substrate and indium cell temperatures, respectively, $E_{des}$ and $E_{in}$ are the activation energies for the chemical reaction and for indium evaporation, respectively, and $k_B$ is the Boltzmann constant. The oxide desorption rate ($R_{des}$) is then given by the product of the chemical rate constant, $\gamma(T_{sub})$, and the flux of etching species arriving on the surface (taken to be indium in this study), $\psi(T_{in})$. The temperature dependence of $R_{des}$ is thus given by:

$$R_{des} \propto \exp\left(-\frac{E_{In}}{k_B \cdot T_{In}}\right) \cdot \exp\left(-\frac{E_{sub}}{k_B \cdot T_{sub}}\right) \quad (3)$$

Plotting the logarithm of the etch rate as a function of $T_{sub}^{-1}$ (or $T_{in}^{-1}$) allows extraction of the active energies of the oxide desorption and indium evaporation, respectively. The insets of FIG. 2 show these dependences of $R_{des}$ on cell temperature and substrate temperature. $R_{des}$ was roughly estimated from the relationship $R_{des} = d_{oxide}/t_{max}$, where $d_{oxide}$ is the oxide layer thickness (about 2 nm from the data provided by supplier) and $t_{max}$ the time at which the RHEED diffraction intensity is strongest (see the desorption curves in FIG. 2). Activation energies of 1.66 and 1.90 eV were obtained for the indium evaporation and oxide desorption, respectively. The activation energy of 1.89 eV for indium evaporation was obtained by using the Knudsen effusion method. This value is slightly higher than that obtained from the oxide desorption experiment, probably as a result of the complexities of the oxide desorption process.

Figure 3:
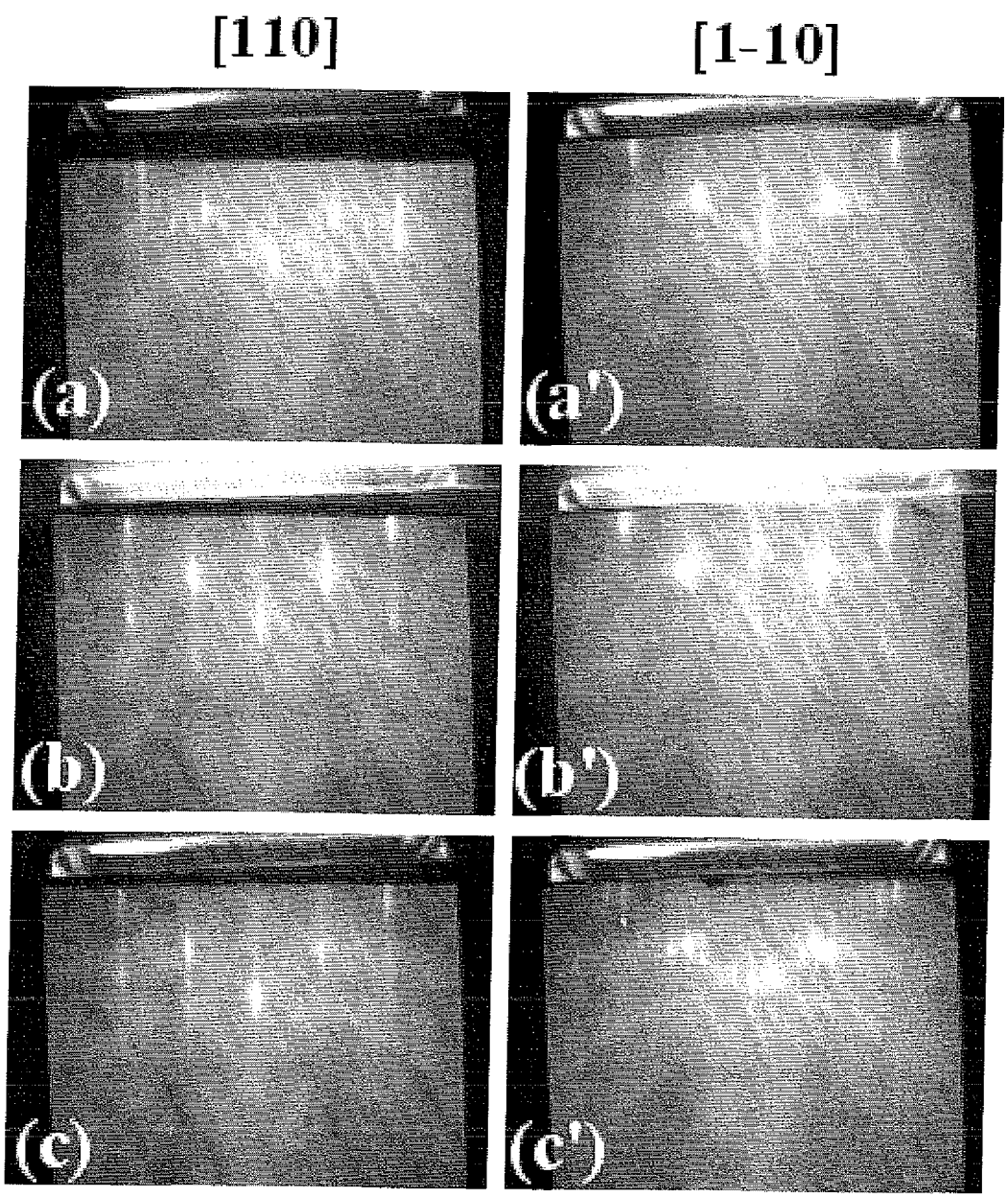
FIG. 3 shows RHEED patterns along the [110] and [1-10] azimuths following air-exposure of an epitaxial wafer: (a) and (a') indium-assisted desorption at 530° C. with an excess indium flux along the [110] and [1-10] azimuths, respectively; (b) and (b') following annealing at 560° C. in the absence of an arsenic overpressure; (c) and (c') at 560° C. under an arsenic overpressure, in methods embodying the invention.

For gallium-assisted desorption, oversupplied gallium is a problem as it locally condenses and forms gallium droplets on the bare GaAs surface. The gallium droplets are hard to remove even if the substrate is increased to 650° C. This is because of the low gallium vapour pressure. Upon annealing under an arsenic flux, the majority of gallium droplets can be converted into GaAs, but a large number of mounds are then observed in the original locations of the gallium droplets. These mounds are very hard to planarize during subsequent epitaxy. The liquid phase of free indium has a much higher evaporation rate at temperatures between 550 and 600° C., a temperature range over which decomposition of GaAs is negligible. For indium-assisted desorption, oversupplied indium can therefore be removed at such temperatures. This is illustrated in FIG. 3 where RHEED patterns taken both along the [110] and [1-10] azimuths on an air-exposed epitaxial wafer are presented. After oxide removal, excess indium was intentionally supplied to the surface. The appearance of the 4× reconstruction along the [110] azimuth clearly indicates an indium-rich surface (FIG. 3(a)). The 4× reconstruction then disappears at higher temperature in the absence of an arsenic overpressure (FIG. 3(b)), suggesting the removal of excess indium. Upon supplying an arsenic flux to the surface, well-defined arsenic-rich 2× and 4× reconstructions develop along the [110] and [1-10] azimuths, respectively (FIGS. 3(c) and 3(c')), indicating that a smooth surface is maintained. It should be noted that under an arsenic overpressure, the excess indium can also be converted into InAs. At substrate temperatures higher than 500° C., however, InAs desorption readily occurs. For example, it has been reported that annealing of InAs QDs at 500° C. results in indium desorption and leaves a smooth surface. In summary, compared to gallium-assisted desorption, precise control of the indium dosage is not critical during indium-assisted desorption. Indeed, a droplet-free smooth surface was obtained on samples for which the indium was intentionally oversupplied and then removed by heating the samples to an elevated temperature (data not shown). A root mean square roughness of only about 0.4 nm was estimated from atomic force microscopy measurement.

Figure 4:
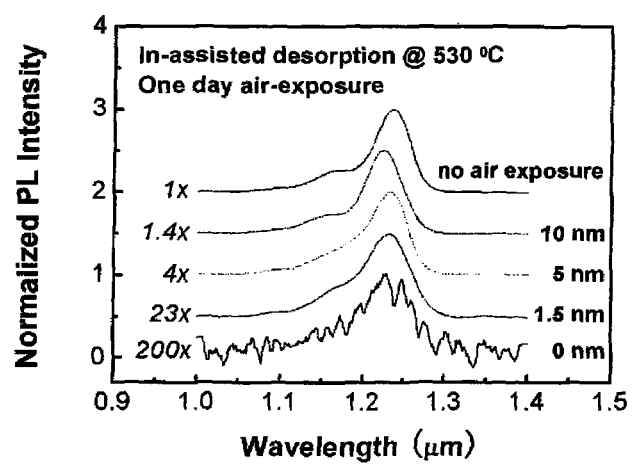
FIG. 4 shows PL spectra of the samples grown in close proximity to the oxide removal interface for different GaAs spacer layer thickness (d=0, 1.5, 5 and 10 nm), in embodiments of the invention.

To confirm the applicability of indium-assisted desorption for epitaxial regrowth, QDs were grown in close proximity to the oxide removal interface. Room temperature photoluminescence (PL) was then used to evaluate the QD optical properties since the technique is very sensitive to non-radiative recombination. Indium-assisted desorption at 530° C. with a flux of $3.2 \times 10^{12}$ atoms·cm$^{-2}$·s$^{-1}$ was used in this case to desorb the oxide layer. Once the oxide was completely removed, the substrate temperature was first ramped up to 560° C. in the absence of an arsenic flux to remove the oversupplied indium, before being ramped up to 600° C. under an arsenic overpressure and kept at this temperature for 600 s so that any residual oxides and remaining indium could be removed. A thin layer of GaAs spacer was then deposited, followed by a 60 s anneal, prior to ramping the substrate temperature down for InAs QD growth at 530° C. The QDs were capped by 100-nm-thick GaAs for PL measurements. FIG. 4 shows the PL spectra of samples with different GaAs spacer thicknesses (d=0, 1.5, 5 and 10 nm). For comparison, the PL spectrum of a QD sample grown immediately after the 500-nm-thick GaAs buffer layer is presented as a reference. The sample grown directly after surface oxide removal (d=0 nm) exhibits inferior optical properties owing to the existence of non-radiative defects introduced during air-exposure and oxide removal. Its PL intensity is two orders-of-magnitude lower than that of the reference sample. However, a thin GaAs spacer layer growth immediately after oxide removal is sufficient to suppress the effects of these defects, and the QD optical properties are dramatically improved with increasing GaAs spacer layer thickness. The PL intensity of the sample with a d=10-nm-thick GaAs spacer layer is nearly comparable to that of the reference sample. Similar results were also reported for gallium-assisted desorption, which has been demonstrated successfully for specific site control of QD growth.

Thus, methods embodying the present invention have been used to demonstrate that the GaAs surface native oxide can be desorbed at low substrate temperature using indium-assisted desorption, owing to the formation of volatile gallium and indium suboxides. Oxide removal depends strongly on the both the substrate temperature and indium cell temperature (and hence indium flux)—both can be fitted well by Arrhenius relationships. From these relationships, activation energies of 1.66 and 1.90 eV for the indium evaporation and oxide desorption reactions, respectively, were deduced. Indium-assisted desorption allows the easy removal of excess indium, without droplet formation, leaving a clean and smooth surface for subsequent regrowth. The feasibility of using indium-assisted desorption for regrowth was confirmed by growth of QD samples. It was found that a GaAs spacer layer as thin as 10 nm was sufficient to suppress detrimental non-radiative recombination arising from the oxide desorbed interface. Indium-assisted desorption is thus expected to be extremely promising for site-control QD growth, and offers advantages over gallium-assisted desorption since any excess indium can easily be removed.

Although the above-described embodiments have used indium fluxes for the removal of gallium oxides, alternative embodiments are concerned with oxide removal from other semiconductor surfaces, as follows.

Generally, thermal removal of Si oxides on a Si wafer surface needs a temperature of above 900° C. A Ga flux is able to remove the oxide at temperatures of about 800° C. in the vacuum of an MBE system. The following chemical reactions may take place:

$SiO_2 + 4Ga = Si + 2Ga_2O\uparrow$ $SiO_2 + 4Ga = SiO\uparrow + 2Ga_2O\uparrow$ In contrast to $SiO_2$, the vapor pressures of both SiO and $Ga_2O$ are high enough at 800° C. that these oxides evaporate. Therefore, surface Si oxide can be removed.

In certain embodiments of the invention, the semiconductor material may be Si. Thus, in certain embodiments, a Si body (e.g. a Si wafer) may be exposed to an In flux, and the following chemical reactions may take place:

$SiO_2 + 4In = Si + 2In_2O\uparrow$ $SiO_2 + 4In = SiO\uparrow + 2In_2O\uparrow$ Since both SiO and $In_2O$ are volatile at 800° C., using In flux in this manner is also expected to be able to remove Si oxide.

In embodiments of the invention where the semiconductor material is Si, the estimated reaction temperature is in the range: 700-850° C. This may therefore be used as the predetermined range, or the body temperature may be set at a value within this range, while exposure to the In flux is ongoing.

In alternative embodiments, the semiconductor body may be selected from a list including: GaAs, GaSb, GaN and GaP wafers, or layers/films/regions/substrates. For these materials, the nonvolatile surface oxide is mainly $Ga_2O_3$. Group-V related compounds are volatile at increased temperature. Hence, a possible chemical reaction taking place on the surface of these wafers is as below:

$Ga_2O_3 + 4In \rightarrow Ga_2O\uparrow + 2In_2O\uparrow$

Estimated reaction temperatures are:
400-550° C. for GaAs
400-510° C. for GaSb and GaP
700-850° C. for GaN In alternative embodiments, the semiconductor body may be selected from a list including: InAs, InSb, InN and InP wafers, or layers/films/regions/substrates.

For these materials, the nonvolatile surface oxide is mainly $In_2O_3$. Group-V related compounds are volatile at increased temperature. Hence, a possible chemical reaction taking place on the surface of these wafers is as below:

$In_2O_3 + 4In \rightarrow 3In_2O\uparrow$

Estimated reaction temperatures are:
400-480° C. for InAs
400-510° C. for InSb and InP It will be appreciated that the above-mentioned specific reaction temperatures and ranges may be used as one or more of the predetermined temperatures and ranges mentioned in the appended claims. In alternative embodiments, different specific values for the predetermined temperatures and limits of the ranges may be employed, for example any of the above-mentioned specific temperatures +/−10, 20, 30, 40, or 50° C.

Presence of indium atoms at an interface in a semiconductor structure may be a signature of the fact that the underlying surface of the interface has been processed (cleaned/prepared) using a method embodying the invention. For example, TEM (Transmission Electron Microscopy) is a technique which is very sensitive to the presence of heavy atoms such as indium inside GaAs crystals, and can be used to identify semiconductor devices/structures that have been manufactured using methods embodying the invention. With a thin specimen, single atoms of indium may be detected. Other techniques for identifying such devices/structures include SIMS (Secondary Ion Mass Spectrometry). Using methods embodying the invention, heating can remove remaining indium on the surface. However, there is In—Ga atom intermixing as the temperature is increased. So, in certain embodiments there may be a small, but observable, amount of Indium left in the samples processed by Indium-assisted desorption.

Methods embodying the invention may be used in the fabrication of distributed feedback (DFB) lasers and/or site controlled QDs, in which re-growth is involved.

Figure 5:
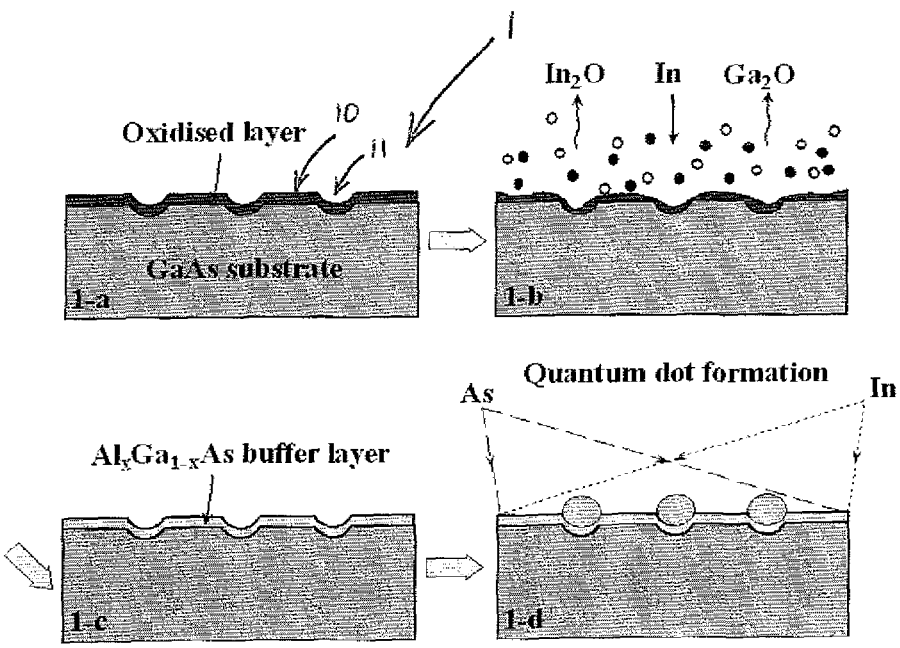
FIG. 5 illustrates steps in the formation of a semiconductor structure incorporating QDs and embodying the invention.
Figure 6:
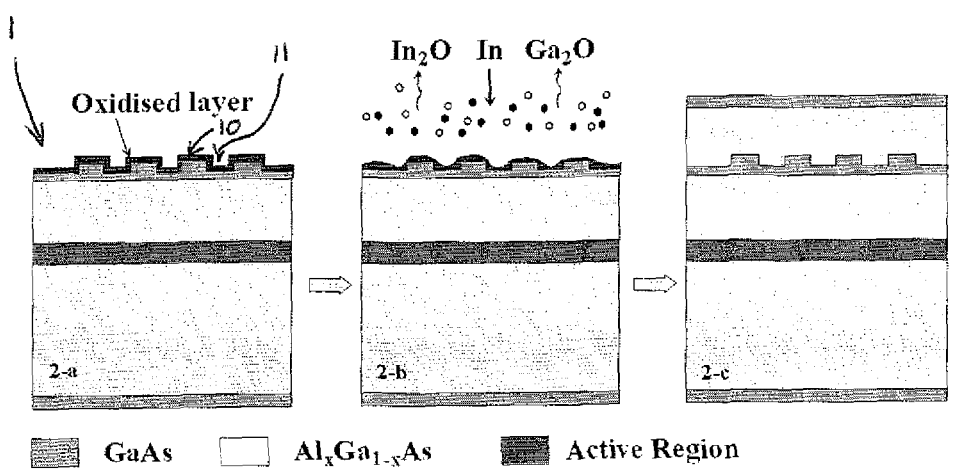
FIG. 6 illustrates steps in the formation of another semiconductor device embodying the invention.

Embodiments thus find application in the overgrowth of site-controlled QDs and DFB lasers. Referring now to FIGS. 5 and 6, for site-controlled QDs and/or DFB lasers on GaAs, patterning of substrates for QD positioning and grating formation is a necessary step. In these figures, reference numeral 1 indicates a body of semiconductor material, 10 indicates an oxidised, patterned surface, and 11 indicates a patterning feature. The patterning, generally prepared outside the growth reactor (for example MBE) by electron-beam lithography and dry/wet chemical etching, leads to the formation of a thin film of oxidised layer on the substrate surface (FIG. 5-a, FIG. 6-a). Prior to overgrowth, the surface oxide is required to be removed. Conventional thermal removal of the oxide on the GaAs substrate, carried out at a substrate temperature of ~580° C. under an arsenic overpressure, leads to pitting of the surface due to the most stable surface oxide $Ga_2O_3$ reacting with the substrate to form a more volatile oxide $Ga_2O$, i.e. $Ga_2O_3 + 4GaAs \rightarrow 3Ga_2O\uparrow + 2As_2$ (or $As_4$)$\uparrow$. The surface pits prevent good site-control QDs being achieved during overgrowth on the patterned substrate by competing with the patterned sites for capture of adatoms. Indium can instead be used, in the absence of arsenic, to remove the surface oxide (FIG. 5-b, FIG. 6-b), by the reaction $Ga_2O_3 + 4In \rightarrow 2In_2O\uparrow + Ga_2O\uparrow$. Owing to high vapour pressure, indium and its compounds, such as $In_2O$ or InAs, can be easily desorbed from the GaAs surface at a substrate temperature around ~500° C., leading to a clean, smooth surface. Although non-radiative recombination arising from the oxide desorbed interface is unavoidable, an $Al_xGa_{1-x}As$ spacer layer as thin as 10 nm is sufficient to suppress their detrimental effects, with minor effects on the features of the patterns (FIG. 5-c). Thus, the growth of good quality site-control QDs on such prepared patterned substrate is feasible and promising (FIG. 5-d). The prepared smooth surface should also be suitable for overgrowing grating layers in AlGaAs-based DFB lasers (FIG. 6-c). In the early 1990's, AlGaAs-based DFB lasers with overgrown gratings generally had large optical loss of over 20 $cm^{-1}$, which could be possibly attributed to the inferior overgrowth interface quality caused by thermal removal of the oxidised layer. The substrate surface prepared by thermal removal of oxide is full of pits. After overgrowth, a large number of interfacial states, possibly behaving as nonradiative recombination centres, could be introduced. The present inventors believe that carrier nonradiative recombination and optical scattering induced by the imperfect interface may play the key roles in increasing the loss. By using the indium-assisted desorption technique for overgrowing the grating in AlGaAs-based DFB lasers, the present inventors expect to suppress the carrier nonradiative recombination and get rid of the effects of the optical scattering, and consequently improve the device performances.

Figure 7:
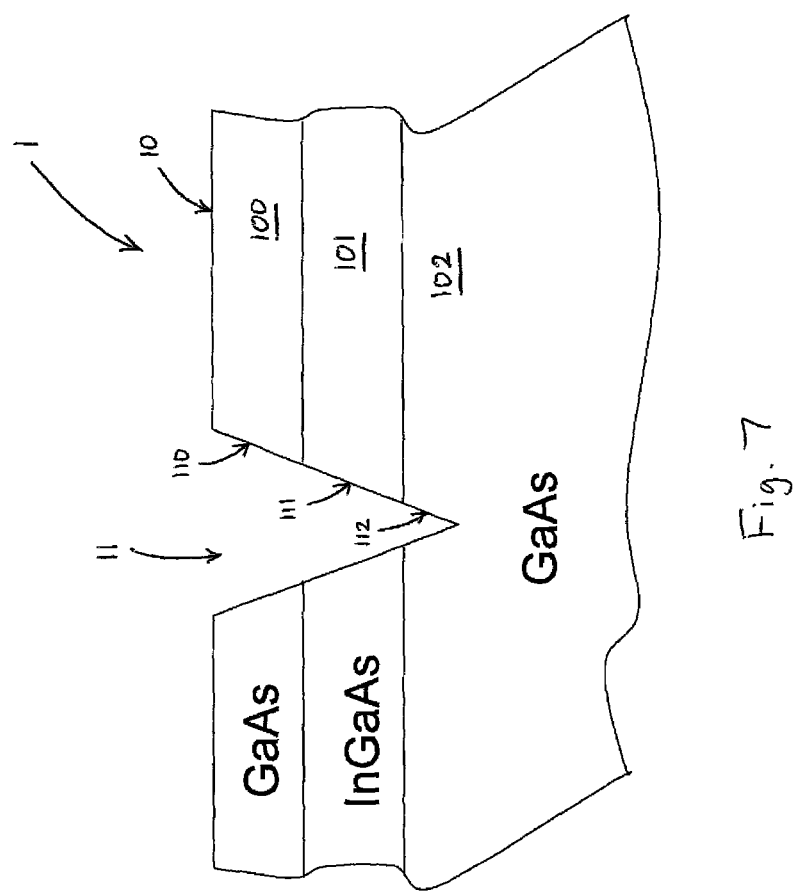
FIG. 7 illustrates part of a body of semiconductor material on which methods embodying the present invention may be practiced.

Referring now to FIG. 7, this illustrates a body 1 of semiconductor material having a patterned, oxidised surface 10, for cleaning/processing with methods embodying the present invention. The body 1 comprises a plurality of layers of different semiconductor materials (InGaAs and GaAs). Each layer 100, 101, 102 can therefore be regarded as a body (or sub-body) in the language of the appended claims, with each layer being identifiable and distinguishable from the other layers. Each layer, or sub-body, has a respective surface 110, 111, 112 which is oxidised and suitable for cleaning/processing with a method embodying the invention to remove the respective oxide or oxides. The surfaces 110, 111, 112 of the layers thus form part of the surface 10 of the composite semiconductor material body 1 as a whole. The surface 10 in this example has been patterned with a groove having a V-shaped cross section, that groove extending down into the body and exposing the above-mentioned surfaces 110, 111, 112 of the respective layers.

The invention claimed is:

1. A method of removing at least one oxide from a surface of a body of semiconductor material, the method comprising:

arranging the body in a vacuum chamber; and maintaining a temperature of the body in the vacuum chamber within a predetermined range, or substantially at a predetermined value, while exposing said surface to a flux of indium atoms.

2. A method of processing an oxidised surface of a body of semiconductor material to prepare the surface for epitaxial growth of at least one epitaxial layer or film over said surface, the method comprising:

using a method in accordance with claim 1 to remove at least one oxide from said oxidised surface.

3. A method of manufacturing a semiconductor device, the method comprising the steps of:

providing a body of semiconductor material having a patterned surface;

processing said surface to form a prepared surface for epitaxial growth of at least one epitaxial layer or film over the surface by using a method in accordance with claim 1 to remove at least one oxide from said surface;

and then, without removing the body from the vacuum chamber, growing an epitaxial layer or film over the prepared surface.

4. A method in accordance with claim 3, wherein providing said body having a patterned surface comprises growing the body in an epitaxial growth chamber, removing the body from the growth chamber, and then patterning said surface out of the growth chamber.

5. A method in accordance with claim 3, wherein providing said body having a patterned surface comprises patterning said surface using a technique which results in oxidation of the patterned surface.

6. A method in accordance with claim 3, wherein said epitaxial layer or film grown over said patterned surface has a thickness of less than or equal to 20 nanometers.

7. A method in accordance with claim 3, wherein said epitaxial layer or film grown over said patterned surface is a buffer layer.

8. A method in accordance with claim 1, wherein arranging the body in a vacuum chamber comprises arranging the body in a chamber and then evacuating the chamber such that said surface is exposed to at least a partial vacuum.

9. A method in accordance with claim 1, wherein maintaining a temperature of the body comprises maintaining the body at a substantially constant temperature while exposing said surface to the flux of indium atoms.

10. A method in accordance with claim 1, further comprising monitoring said surface using a reflection high-energy electron diffraction (RHEED) technique while exposing said surface to the flux of indium atoms.

11. A method in accordance with claim 1, wherein said exposing of said surface to the flux of indium atoms comprises exposing said surface to said flux for a duration of between 30 seconds and 1 hour.

12. A method in accordance with claim 1, wherein said flux of indium atoms is in the range $1 \times 10^{12}$ to $1 \times 10^{14}$ atoms per square centimeter per second.

13. A method in accordance with claim 1, further comprising ceasing said flux of indium atoms and maintaining a temperature of the body within a second predetermined range, or substantially at a second predetermined temperature, for a period of time.

14. A method in accordance with claim 1, further comprising ceasing said flux of indium atoms and supplying a flux of As while maintaining a temperature of the body within a third predetermined range, or substantially at a third predetermined temperature, for a period of time.

15. A method in accordance with claim 1, further comprising forming said body by epitaxial growth.

16. A method in accordance with claim 1, wherein said semiconductor material is a Group III-V or a Group IV semiconductor.

17. A method in accordance with claim 1, wherein said semiconductor material is silicon.

18. A method in accordance with claim 17, wherein said maintaining a temperature of the body in the vacuum chamber within a predetermined range, or substantially at a predetermined value, while exposing said surface to a flux of indium atoms comprises maintaining a temperature of the body in the range 700° C. to 850° C. while exposing said surface to said flux.

19. A method in accordance with claim 1, wherein said semiconductor material is GaAs.

20. A method in accordance with claim 19, wherein said at least one oxide comprises gallium oxide.

21. A method in accordance with claim 19, wherein said maintaining a temperature of the body in the vacuum chamber within a predetermined range, or substantially at a predetermined value, while exposing said surface to a flux of indium atoms comprises maintaining a temperature of the body in the range 400° C. to 550° C. while exposing said surface to said flux.

22. A method of manufacturing a semiconductor device, the method comprising the steps of:

providing a body of semiconductor material having an oxidised surface;

processing said oxidised surface to form a prepared surface for epitaxial growth of at least one epitaxial layer or film over the prepared surface by using a method to remove at least one oxide from said oxidised surface;

wherein the method comprises arranging the body in a vacuum chamber and maintaining a temperature of the body in the vacuum chamber within a predetermined range, or substantially at a predetermined value, while exposing said surface to a flux of indium atoms;

and then, without removing the body from the vacuum chamber, growing an epitaxial layer or film over the prepared surface.

23. A method in accordance with claim 22, wherein providing said body having an oxidised surface comprises growing the body in an epitaxial growth chamber and then removing the body from the epitaxial growth chamber.

24. Use of indium for the removal of at least one oxide from a surface of a body of semiconductor material.

25. Use of indium in the processing of an oxidised surface of a body of semiconductor material to prepare the surface for epitaxial growth of an epitaxial layer or film over said surface.

* * * * *